United States Patent [19]

Foote

[11] 4,408,088
[45] Oct. 4, 1983

[54] ARAMID REINFORCED THERMOCOUPLE CABLE

[75] Inventor: Danny R. Foote, Spirit Lake, Iowa

[73] Assignee: Berkley and Company, Inc., Spirit Lake, Iowa

[21] Appl. No.: 347,524

[22] Filed: Feb. 10, 1982

[51] Int. Cl.³ .............................................. H01F 35/28
[52] U.S. Cl. ..................................... 136/226; 29/573;
34/48; 136/230; 174/120 SR
[58] Field of Search ...................... 29/573; 34/45, 48;
136/226, 227, 230; 174/120 SR

[56] References Cited

U.S. PATENT DOCUMENTS

| 2,665,322 | 1/1954  | MacDonald ............... 136/227 X |
| 3,607,446 | 9/1971  | Chang et al. .............. 136/226  |
| 3,845,706 | 11/1974 | Strimple et al. ........... 136/230 X |
| 4,277,886 | 7/1981  | Bauer et al. .............. 29/573    |

FOREIGN PATENT DOCUMENTS 1089966 11/1967 United Kingdom ............... 136/226
1386837  6/1973 United Kingdom ............... 136/230

OTHER PUBLICATIONS

Brochure: DuPont de Nemours & Co., "Properties and Uses of KEVLAR 29 and KEVLAR 49 in Electromechanical Cables and Fiber Optics," Information Bulletin K-506A, Jun. 1980.

Primary Examiner—Leland A. Sebastian
Attorney, Agent, or Firm—Kinney, Lange, Braddock, Westman & Fairbairn

[57] ABSTRACT

A thermocouple cable reinforced with high strength, low creep fatigue resistant aramid fibers. The aramid fibers are pultruded over a central core of thermocouple wires. A water impervious, abrasion resistant, strippable cover is extruded over the fibers and wires to hold them firmly in place.

5 Claims, 3 Drawing Figures

ARAMID REINFORCED THERMOCOUPLE CABLE

BACKGROUND OF THE PRIOR ART

After harvesting, grain is usually dried and stored until the market is favorable to its sale. Since grain is largely sold by weight, it becomes important to have the maximum allowable moisture content in the grain before it is sold. If the moisture is maximized, the seller receives more for the same harvest of grain due to the extra weight provided by water.

In order to permit high moisture content grain to be safely stored without risk of deterioration, temperature sensing systems currently use thermocouple wires with sensors every few feet. Such cable sensors detect spot temperature changes caused by moisture migration, insect infestation, foreign matter accumulation or bacterial or mold contamination. The sensor can either localize the problem so that it can be eliminated or allow an operator to cool the grain to avoid moisture loss by overheating.

The conventional thermocouple wires used in grain temperature sensing consist of a stranded steel strength member adjacent to a bundle of thermocouple wires coated with polyethylene to insulate them from the steel strength member. A nylon coating then encloses both the stranded steel member and the coated thermocouple wires. Such a system has disadvantages in that moisture can short out contacts; stripping the multiple coatings makes difficult the connecting of the wires to other components of the sensing system and greatly increases the difficulty in manufacturing cables having multiple levels of coatings.

Additionally, loading and unloading of grain bins produces tension and fatigue problems in the present cable system. Wires stretch and break, and the insulation between the steel strength member and conductive wires separates, resulting in short circuits.

Other prior art thermocouple cables using fiberglass bundles circumferentially dispersed around an axial bundle of thermocouple wires do not provide satisfactory results in grain temperature measuring where there is a constant load on the cables because the fiberglass creeps with time, thereby weakening the cable and making it unsuitable for continued use.

Another prior art thermocouple cable utilizes strands of steel circumferentially dispersed around an axial bundle of thermocouple wires. This system provides the needed strain bearing support, but has many disadvantages. The steel makes the cable much heavier than desired and requires very good insulation and careful handling to avoid cutting the insulation, resulting in a short-circuit. The cable is difficult to construct due to the quantities of the wires and insulation layers.

BRIEF SUMMARY OF THE INVENTION

The invention consists of a thermocouple wire cable, particularly suited for use in grain bin applications. The thermocouple wires are arranged as a bundle in parallel and may be twisted. The strain bearing function is supplied by concentric layering of high strength, high modulus aramid fibers, such as fibers manufactured by E. I. DuPont deNemours & Co. of Wilmington, Delaware, under the trademark Kelvar.

In the cable manufacturing process, tension is applied to each aramid strand and the strands are fed through a spider to align them circumferentially. In the preferred embodiment, a "tube-on" extrusion of polyethylene, polypropylene, polyurethane or nylon is vacuum drawn onto the substantially round substrate cable and the plutruded aramid strands. Although the tube-on processing insures centering and a uniformly thin coating, other extrusion processsses may be used.

The aramid fibers provide strength and low stretch and creep resistance under lead. The cross-head extrusion of polypropylene provides a water impervious, strippable layer. Fatigue resistance is substantially improved over fiberglass support members. No stranded steel strength member is present to cut through the insulation of the thermocouple wires. Manufacturing is simplified in that multiple insulation coats are not required as in the steel strength member cable. The high strength, low stretch aramid fibers lessen the undesirable fatigue which results from use of the cable on grain bins and conductor breakage is thereby minimized.

BRIEF DESCRIPTION OF THE DRAWINGS

A detailed description of one preferred embodiment of the invention is hereinafter described with particular references being made to the drawings in which.

DETAILED DESCRIPTION OF THE INVENTION

Figure 1:
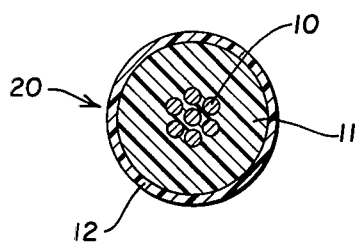
FIG. 1 is a cross-sectional view of the cable.
Figure 3:
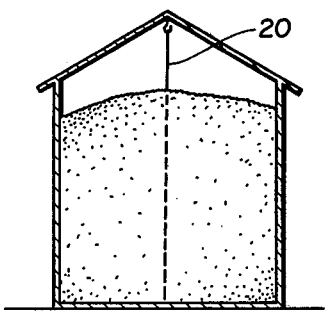
FIG. 3 depicts the cable in place in a grain bin.
Figure 2:
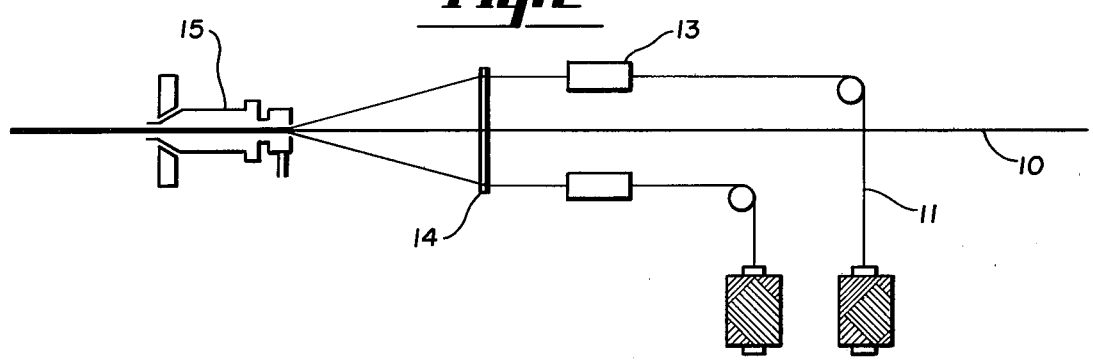
FIG. 2 is a schematic of a typical production line for manufacturing the cable.

In the preferred embodiment, thermocouple wires 10 with a thermocouple at intervals from three to ten feet typically are guided through a spider 14 and a guider tip in an extruder 15 so as to align the wires 10 longitudinally in a round, tightly bunched packet. Any number of thermocouple wires 10 may be utilized, seven and thirteen, including a ground, being typical suitable versions of the cable.

Aramid strain fibers 11 are pultruded, a process which applies equal tension to each aramid fiber 11. Aramid fibers 11, preferably of 1500 denier, are pulled from end feeding spools 16 to tension control fingers 13, preferably ceramic, where a uniform tension is applied to each strand of the aramid fiber 11. The fibers 11 then engage a spider 14 to align the fibers 11 circumferentially over the thermocouple wires 10. The fibers 11 then pass through the guider tip in the extruder 15.

A water impervious, strippable cover 12 coats the aramid fibers 11 and thermocouple wires 10. This cover 12 is preferably polyethylene or polypropylene forced out as a sleeve or tube that is vacuum drawn onto the substrate thermocouple wires 10 and pultruded aramid fibers 11.

A twelve thermocouple cable was manufactured using thirteen strands of copper wire 10 coated with a medium density polyethylene. Twenty-six bundles of 1500 denier aramid fiber strands 11 ran through twelve tension controlling fingers 13 and a twelve hole spider 14. A polyethylene cover 12 was extruded on by a "tube-on" extruder 15 resulting in a coating diameter of 0.190 inches. The resultant strength of the thermocouple cable 20 was 1140 pounds.

Thermocouple cables constructed in accordance with the invention, because they eliminate the necessity of using multiple insulating layers, have a substantially reduced circumference and a reduced weight. The reduced circumference, in turn, serves to minimize the long-term frictional load on thermocouple cable which is buried in a grain storage facility. The reduced weight of the cable also minimizes the loading at the point where the cable is suspended above the storage facility.

In considering the invention, it should be remembered that the present disclosure is illustrative only, and the scope of the invention should be determined by the appended claims.

I claim:

1. A thermocouple cable comprising:
   thermocouple wires in parallel relation;
   a pultrusion of aramid fibers concentrically layered over said thermocouple wires; and
   an extruded water impervious abrasion resistant layer over said aramid fibers and said thermocouple wires.

2. The thermocouple cable of claim 1 wherein said extruded water impervious abrasion resistant layer consists of polyethylene, polypropylene or polyurethane.

3. A thermocouple cable comprising:
   thermocouple wires in close parallel relation;
   a pultrusion of aramid fibers concentrically layered over said thermocouple wires; and
   an extruded layer of polypropylene coating said aramid fibers and said thermocouple wires.

4. The process of forming the cable of claim 1, wherein:
   thermocouple wires are drawn through a spider means, guide means and extruder means;
   aramid fibers are drawn across tension finger means, circumferentially aligned by said spider means and said guide means into said extruder means; and
   a water resistant abrasion resistant layer is extruded over said aramid fibers and said thermocouple wires.

5. A thermocouple cable constructed and arranged for suspension above a grain storage facility with a substantial portion of the length of the cable buried in grain stored in said facility for monitoring the temperature of said grain; said cable comprising, in combination:
   a plurality of thermocouples positioned at distributed points along the length of said cable;
   a plurality of conductors, each of which is connected at one end to one of said plurality of thermocouple wires; and
   a single layer of insulating material extruded over said aramid fibers, said conductors and said thermocouples.

* * * * *